(12) United States Patent
Kim

(10) Patent No.: US 7,084,452 B2
(45) Date of Patent: Aug. 1, 2006

(54) SEMICONDUCTOR DEVICE HAVING ONE-TIME PROGRAMMABLE ROM AND METHOD OF FABRICATING THE SAME

(75) Inventor: Myoung-Soo Kim, Suwon-shi (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/722,935

(22) Filed: Nov. 26, 2003

(65) Prior Publication Data

US 2004/0108539 A1    Jun. 10, 2004

(30) Foreign Application Priority Data

Dec. 6, 2002   (KR)   ............. 10-2002-0077289

(51) Int. Cl.
  *H01L 29/76*   (2006.01)
  *H01L 29/788*  (2006.01)
(52) U.S. Cl. ............................ 257/314; 257/315
(58) Field of Classification Search ........ 257/314–322
  See application file for complete search history.

(56) References Cited

U.S. PATENT DOCUMENTS 6,259,126 B1 *  7/2001  Hsu et al. ............. 257/298
6,602,749 B1 *  8/2003  Tu et al. ............... 438/253
6,730,950 B1 *  5/2004  Seshadri et al. ...... 257/295
2002/0024083 A1  2/2002  Noble et al. ........... 257/306

FOREIGN PATENT DOCUMENTS

KR    1998-79703    11/1998

* cited by examiner

*Primary Examiner*—Hung Vu
(74) *Attorney, Agent, or Firm*—F. Chau & Associates, LLC

(57) ABSTRACT

A semiconductor device with a one-time programmable (OTP) ROM disposed over a semiconductor substrate including a memory cell area and a peripheral circuit area includes a MOS transistor and an OTP ROM capacitor. The MOS transistor has a floating gate electrode and is disposed at the memory cell area. The OTP ROM capacitor has a lower electrode, an upper intermetal dielectric, and an upper electrode which are stacked in the order named. The OTP ROM capacitor is disposed on the MOS transistor, and the floating gate electrode and the lower electrode are connected by a floating gate plug to constitute an electrically insulated conductive structure. The upper intermetal dielectric is made of at least one selected from the group consisting of silicon oxide, silicon nitride, and silicon oxynitride and may be disposed on an entire surface of the semiconductor substrate. A capacitor formed together with the OTP ROM is disposed at the peripheral circuit region.

9 Claims, 8 Drawing Sheets

SEMICONDUCTOR DEVICE HAVING ONE-TIME PROGRAMMABLE ROM AND METHOD OF FABRICATING THE SAME

TECHNICAL FIELD

The present disclosure relates to a semiconductor device and a method of fabricating the same. More specifically, the present disclosure is directed to a semiconductor device having a one-time programmable ROM (OPT ROM) and a method of fabricating the same.

DISCUSSION OF RELATED ART

One-time programmable ROM (OPT ROM) cannot be reprogrammed or erased after initial programming. Since it is impossible to change information stored in an OTP ROM, the OTP ROM is not used itself as a semiconductor product but instead as a means for performing a subfunction.

In addition, since the number of OTP ROMs embedded in one semiconductor device is small, OTP ROMs do not occupy a large area of a semiconductor device. OTP ROMs have a stack structure to achieve a non-volatile characteristic, which leads to higher fabricating cost.

A conventional OTP ROM is now described below with reference to FIG. 1.

Referring to FIG. 1, a device isolation layer 20 is disposed at a predetermined region of a semiconductor substrate 10 to define an active region. A gate insulating layer 30 is formed on the active region. A gate electrode 40 is disposed over the gate insulating layer 30 across the active region and the device isolation layer 20. The gate electrode 40 includes a floating gate electrode 42, an intergate dielectric 44, and a control gate electrode 46 which are stacked in the order named. The gate electrode 40 may further include a capping pattern 48 disposed on the control gate electrode 46. Thus, the gate electrode 40 has a stack structure elevated by the thickness of the capping pattern 48. Impurity regions 50 form a source at one side of the gate electrode 40 and a drain at another side of the gate electrode.

Conventional MOS transistors (i.e., without the intergate dielectric 44) are disposed at another region (peripheral circuit region) of the semiconductor substrate 10. The MOS transistors constitute a logic circuit. As previously stated, in a semiconductor product using an OTP ROM, the logic circuit has a main function and the OTP ROM has a subfunction.

An OTP ROM having a stack structure including an intergate dielectric 44 is not suitable for processing with the logic circuit. The floating gate electrode 42 is completely electrically insulated and, depending upon the fabrication process, a gate electrode of the logic circuit is also electrically insulated, thereby preventing the OTP ROM from operating normally. Thus, the intergate dielectric 44 must be removed using an etch mask that covers a region where the OTP ROM is formed, resulting in increased process cost.

Since the number of the OTP ROMs is small, a photolithographic process for forming the control gate electrode 46 may be unstably performed. Therefore, a dummy pattern is typically formed around the OTP ROM. However, the dummy pattern is unsuitable for high integration because it occupies a larger area.

SUMMARY OF THE INVENTION

A semiconductor device according to an embodiment of the invention includes an OTP ROM disposed over a semiconductor substrate including a memory cell area and a peripheral circuit area. A MOS transistor having a floating gate electrode is disposed at the memory cell area. The OTP ROM capacitor is disposed over the MOS transistor and has a lower electrode, an upper intermetal insulating layer, and an upper electrode which are stacked in the order named. The floating gate electrode and the lower electrode are connected by a floating gate plug. The floating gate electrode, the floating gate plug, and the lower electrode constitute a conductive structure which is electrically insulated.

The conductive structure is used as a charge storage of the OTP ROM. A capacitor having the same structure (i.e., same material and thickness) as the OTP ROM capacitor is disposed at the peripheral circuit area. The capacitor includes a lower capacitor electrode, a dielectric film, and an upper capacitor electrode which are sequentially stacked over the peripheral circuit area. In accordance with an embodiment of the invention, the upper intermetal dielectric and the dielectric film constitute one undistinguishable body. Preferably, the upper intermetal dielectric is made of at least one selected from the group consisting of silicon oxide, silicon nitride, and silicon oxynitride. The upper intermetal dielectric is disposed over an entire surface of the semiconductor substrate. A contact plug is connected to an impurity region of the semiconductor substrate and is made of the same material as the floating gate plug.

A method of fabricating a semiconductor device according to an embodiment of the invention includes forming a floating gate electrode over a semiconductor substrate, forming a lower electrode electrically connected to the floating gate electrode, forming an upper intermetal dielectric over an entire surface of the semiconductor substrate including the lower electrode, and forming an upper electrode over the upper intermetal dielectric. The upper electrode crosses over the lower electrode.

In accordance with at least one embodiment of the invention, before formation of the floating gate electrode, a device isolation layer is formed at a predetermined region of the semiconductor substrate to define an active region and a gate insulating layer is formed at the active region.

In accordance with at least one embodiment of the embodiment, the formation of the lower electrode includes forming an interlayer dielectric over an entire surface of the semiconductor substrate including the floating gate electrode, patterning the interlayer dielectric to form a floating gate contact hole exposing a top surface of the floating gate electrode, forming a floating gate plug to fill the floating gate contact hole, forming a lower conductive layer on an entire surface of the semiconductor substrate including the floating gate plug, and patterning the lower conductive layer to form the lower electrode electrically connected to the floating gate plug.

In accordance with at least one embodiment of the invention, before formation of the upper intermetal dielectric, a lower intermetal dielectric is formed on an entire surface of the semiconductor substrate including the lower electrode and the lower intermetal dielectric is patterned to form an OTP ROM exposing a top surface of the lower electrode.

In accordance with at least one embodiment of the invention, the upper intermetal dielectric is made of at least one selected from the group consisting of silicon oxide, silicon nitride, and silicon oxynitride. The upper intermetal dielectric is used as an etch-stop layer during a process for forming the upper electrode. The intermetal dielectric remains on an entire surface of the semiconductor substrate after formation of the upper electrode.

A method of fabricating a semiconductor device with an OTP ROM disposed over a semiconductor substrate including a memory cell area and a peripheral circuit area according to another embodiment of the invention includes forming a floating gate electrode over the memory cell area of the semiconductor substrate, simultaneously forming a lower electrode electrically connected to the floating gate electrode at the memory cell area and a lower capacitor electrode disposed at the peripheral circuit area, forming a dielectric film on an entire surface of the semiconductor substrate including the lower electrode and the lower capacitor electrode, and simultaneously forming an upper electrode and an upper capacitor electrode over the dielectric film. The upper electrode crosses over the lower electrode, and the upper capacitor electrode crosses over the lower capacitor electrode.

BRIEF DESCRIPTION OF THE DRAWINGS

Embodiments of the invention will be described with reference to the accompanying drawings in which.

DESCRIPTION OF PREFERRED EMBODIMENTS

Figure 1:
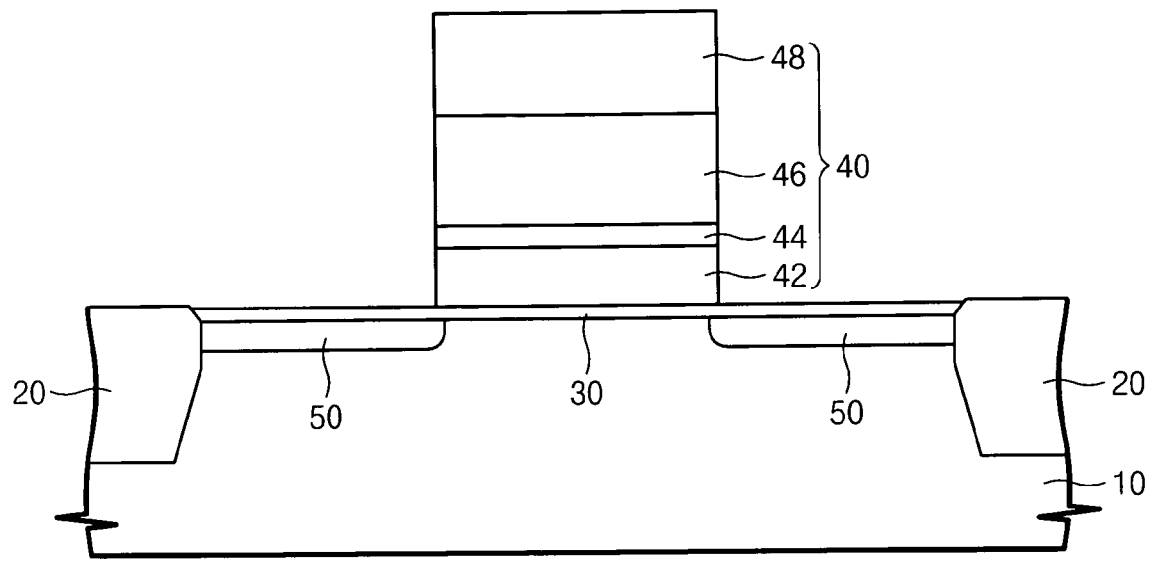
FIG. 1 is a cross-sectional view of a conventional OTP ROM.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

A semiconductor device including an OTP ROM according to an embodiment of the present invention is now described below with reference to FIG. 2 through FIG. 5.

Figure 2:
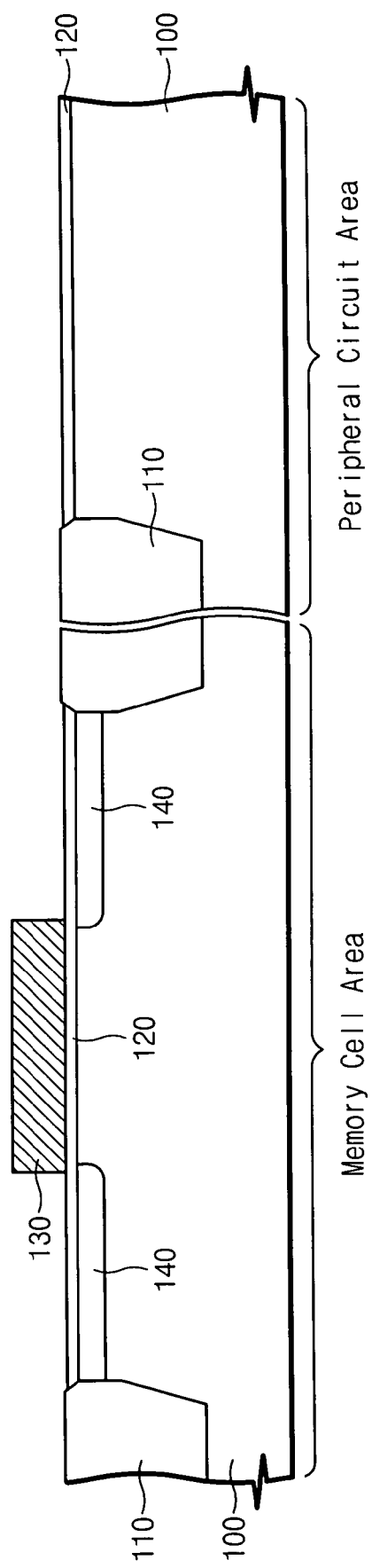
FIG. 2 through FIG. 5 are cross-sectional views showing a method of fabricating a semiconductor device including an OTP ROM according to an embodiment of the present invention.

Referring to FIG. 2, a semiconductor substrate 100 including a memory cell area and a peripheral circuit area is prepared. OTP ROMs according to an embodiment of the invention are formed at the memory cell area, and logic circuits according to an embodiment of the invention are formed at the peripheral circuit area. A device isolation layer 110 is formed at a predetermined region of the semiconductor substrate 100 to define an active region. The device isolation layer 110 may be a trench-type device isolation layer or a LOCOS-type device isolation layer and may be made of, for example, silicon oxide or silicon nitride.

A gate insulating layer 120 is formed on the active region. Preferably, the gate insulating layer 120 is a silicon oxide layer that is formed by thermally oxidizing the semiconductor substrate 100 at the active region.

A floating gate electrode 130 is formed on the semiconductor substrate 100 including the gate insulating layer 120. Preferably, the floating gate electrode 130 crosses the active region and stops at a top surface of the device isolation layer 110. The floating gate electrode 130 has an islet shape. The floating gate electrode 130 is made of at least one selected from the group consisting of polysilicon, tungsten, tungsten nitride, tungsten silicide, and cobalt silicide. The floating gate electrode 130 according to an embodiment of the invention is preferably formed by performing a patterning process once, but may also be formed by performing the patterning process twice.

An ion implanting process is carried out to form impurity regions 140 at active regions adjacent to opposite sides of the floating gate electrode 130. The impurity region 140 may have a lightly doped drain (LDD) structure. For this, there is a need for an additional process of forming a spacer (not shown) on a sidewall of the floating gate electrode 130. The impurity region 140 is used as a source/drain of an MOS transistor.

Figure 3:
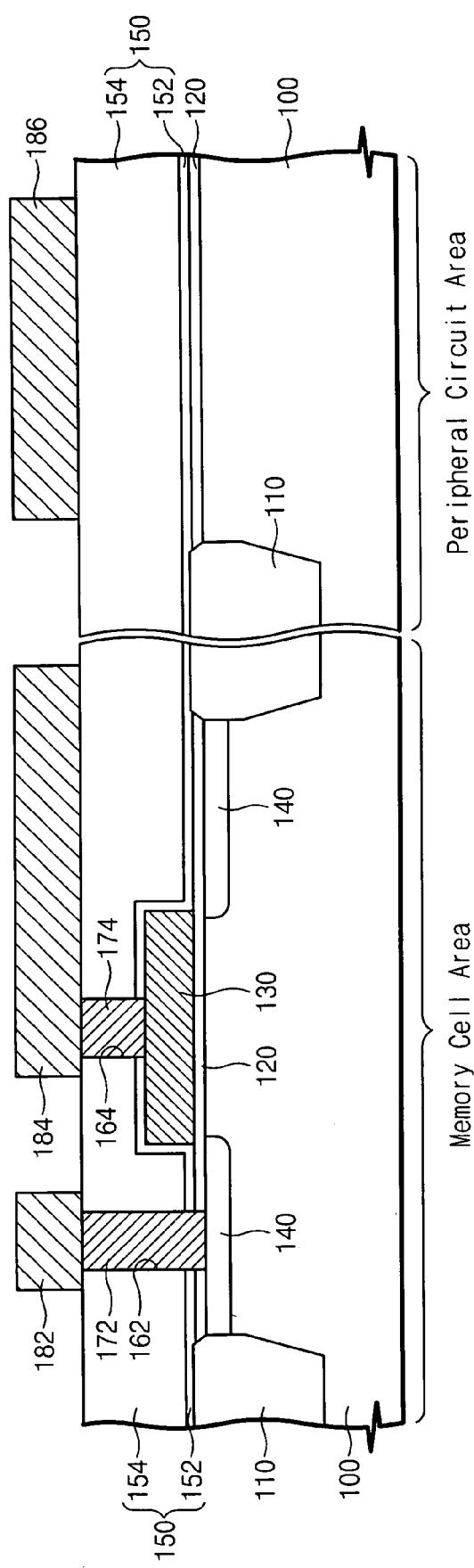

Referring to FIG. 3, an interlayer dielectric 150 is formed on an entire surface of the semiconductor substrate 100 where the impurity region 140 is formed. Thus, the interlayer dielectric 150 is also formed at the peripheral circuit region.

The interlayer dielectric 150 is preferably made of silicon oxide but may also be a dual layer of silicon oxide and silicon nitride. According to at least one embodiment of the present invention, the interlayer dielectric 150 includes a lower interlayer dielectric 152 and an upper interlayer dielectric 154 which are stacked in the order named. Preferably, the lower interlayer dielectric 152 is made of silicon nitride, and the upper interlayer dielectric 154 is made of silicon oxide. The lower interlayer dielectric 152 conformally covers an entire surface of the semiconductor substrate 100 where the floating gate electrode 130 is formed. The upper interlayer dielectric 154 is formed on an entire surface of the semiconductor substrate 100 including the lower interlayer dielectric 152. Preferably, the upper interlayer dielectric 154 has a planarized top surface. For this, formation of the upper interlayer dielectric 154 includes a planarizing process.

The interlayer dielectric 150 is patterned to form a floating gate contact hole 164 exposing the floating gate electrode 130 and an impurity region contact hole 162 exposing the impurity region 140. A plug conductive layer is then formed on the resultant structure. The conductive layer is etched down to a top surface of the upper interlayer dielectric 154 to form a floating gate plug 174 filling the floating gate contact hole 164 and a contact plug 172 filling the impurity region contact hole 162. In addition, plugs needed for operation of logic circuits may also be formed at the peripheral circuit region. Preferably, formation of these plugs is done by performing a process including forming the floating gate plug 174 and the contact plug 172.

A lower conductive layer is formed on an entire surface of the semiconductor substrate 100 including the floating gate plug 174 and the contact plug 172. The lower conductive layer may have multiple structures including a capping conductive layer. The lower conductive layer is preferably made of at least one selected from the group consisting of aluminum, tungsten, titanium, polysilicon, tungsten nitride, and titanium nitride. The lower conductive layer is patterned to from a lower electrode 184 contacting the floating gate plug 174 and a bitline 182 contacting the contact plug 172. Similar to the floating gate electrode 130, the lower electrode 184 is not extended to an adjacent cell and has an isolated structure. On the other hand, the bitline 182 may be electrically connected to impurity regions 140 of adjacent cells.

During formation of the lower electrode 184, the lower conductive layer stacked at the peripheral circuit region is patterned to form a lower capacitor electrode 186 constituting a capacitor for use in a logic circuit. In exemplary embodiments of the invention, the lower electrode 184 and the bitline 182 are formed together with the capacitor 186.

Figure 4:
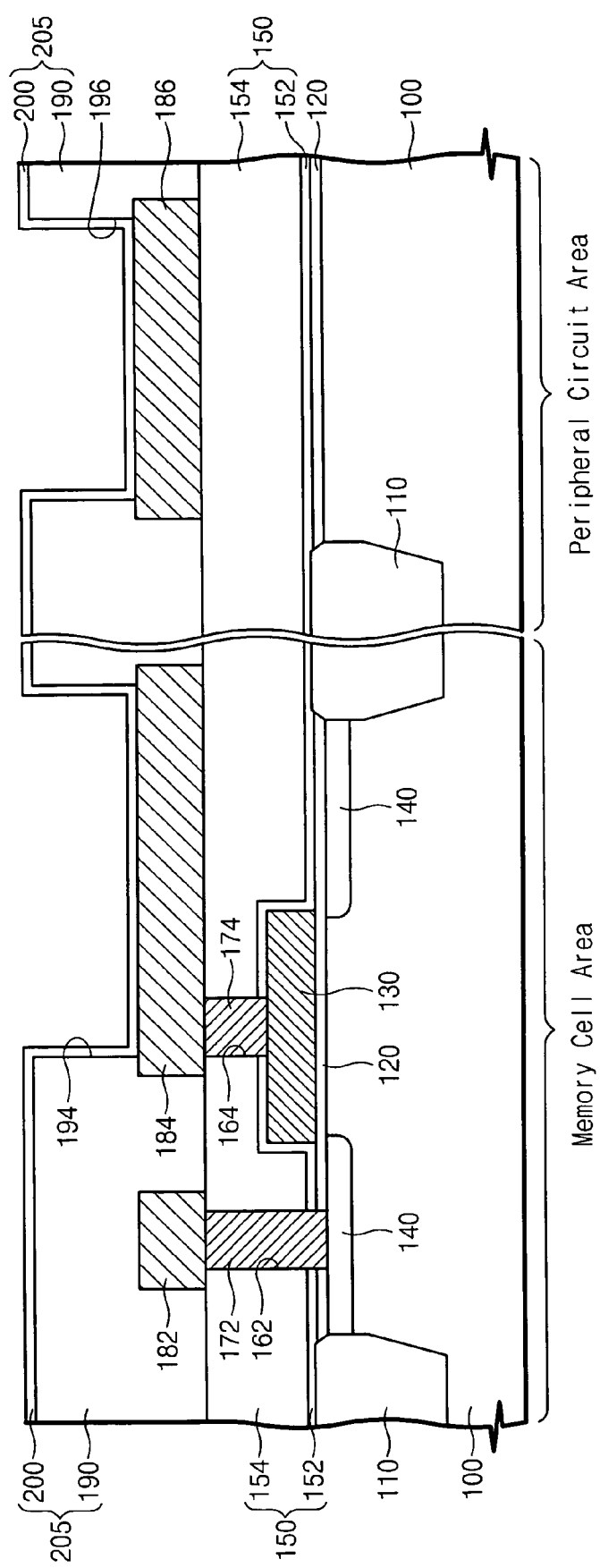

Referring to FIG. 4, an intermetal dielectric 205 is formed over the semiconductor substrate 100. Preferably, the intermetal dielectric 205 includes a lower intermetal dielectric 190 and an upper intermetal dielectric 200. The lower intermetal dielectric 190 is formed on an entire surface of the semiconductor substrate 100 including the upper electrode 184, the bitline 182, and the lower capacitor electrode 186. Preferably, the lower intermetal dielectric 190 is a silicon oxide layer that is formed using a chemical vapor deposition (CVD) technique.

The lower intermetal dielectric 190 is patterned to form an OTP ROM opening 194 exposing a top surface of the lower electrode 184 and a capacitor opening 196 exposing a top surface of the lower capacitor electrode 186.

The upper intermetal dielectric 200 is conformally formed on an entire surface of the semiconductor substrate 100 where the OTP ROM opening 194 and the capacitor opening 196 are formed. The upper intermetal dielectric 200 is preferably made of, for example, silicon oxide, silicon nitride or silicon oxynitride, and more preferably the silicon oxide and the silicon nitride are plasma enhanced oxide (PEOX) and plasma enhanced silicon nitride (PE-SiN) formed using a plasma enhanced chemical vapor deposition (PECVD) technique to a thickness of approximately 300 angstroms and at least 900 angstroms, respectively.

The conductive structure including the floating gate electrode 130, the floating gate plug 174, and the lower electrode 184 is completely electrically insulated by the gate insulating layer 120, the interlayer dielectric 150, and the intermetal dielectric 205.

Figure 5:
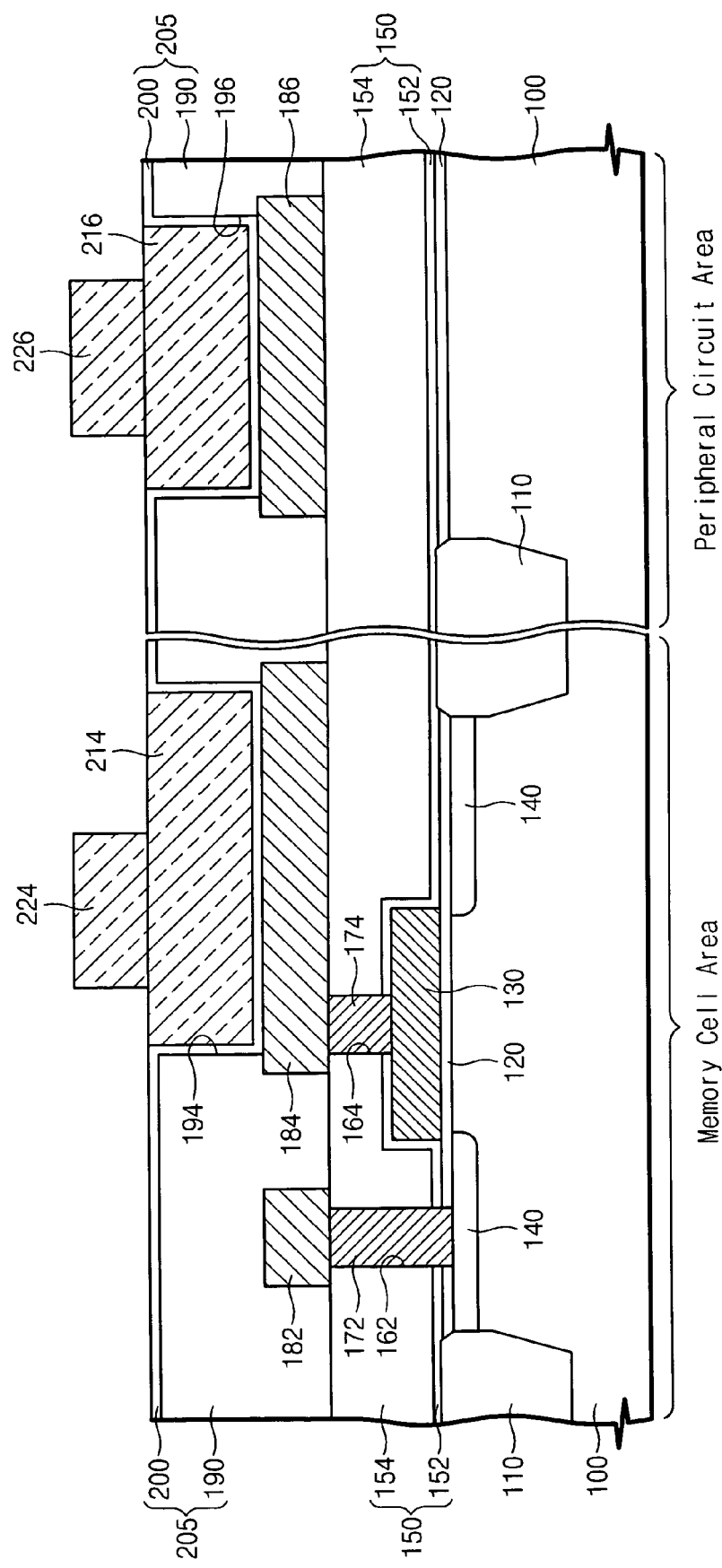

Referring to FIG. 5, a first upper conductive layer is formed on an entire surface of the semiconductor substrate 100 including the upper intermetal dielectric 200. The first upper conductive layer is etched down to a top surface of the upper intermetal dielectric 200 to form a first upper electrode 214 filling the OTP ROM opening 194 and a first upper capacitor electrode 216 filling the capacitor opening 196. The etching of the first upper conductive layer is achieved using an etch recipe having an etch selectivity with respect to the upper intermetal dielectric 200. The silicon nitride layer constituting the upper intermetal dielectric 200 acts as an etch-stop layer. Preferably, the first upper conductive layer is made of at least one selected from the group consisting of tungsten, copper, titanium, aluminum, polysilicon, tungsten nitride, and titanium nitride.

A second upper conductive layer is formed on an entire surface of the semiconductor substrate 100 including the first upper electrode 214 and the first upper capacitor electrode 216. The first upper conductive layer is patterned to form a second upper electrode 224 coupled to the first upper electrode 214 and a second upper capacitor electrode 226 coupled to the first upper capacitor electrode 216.

Figure 6:
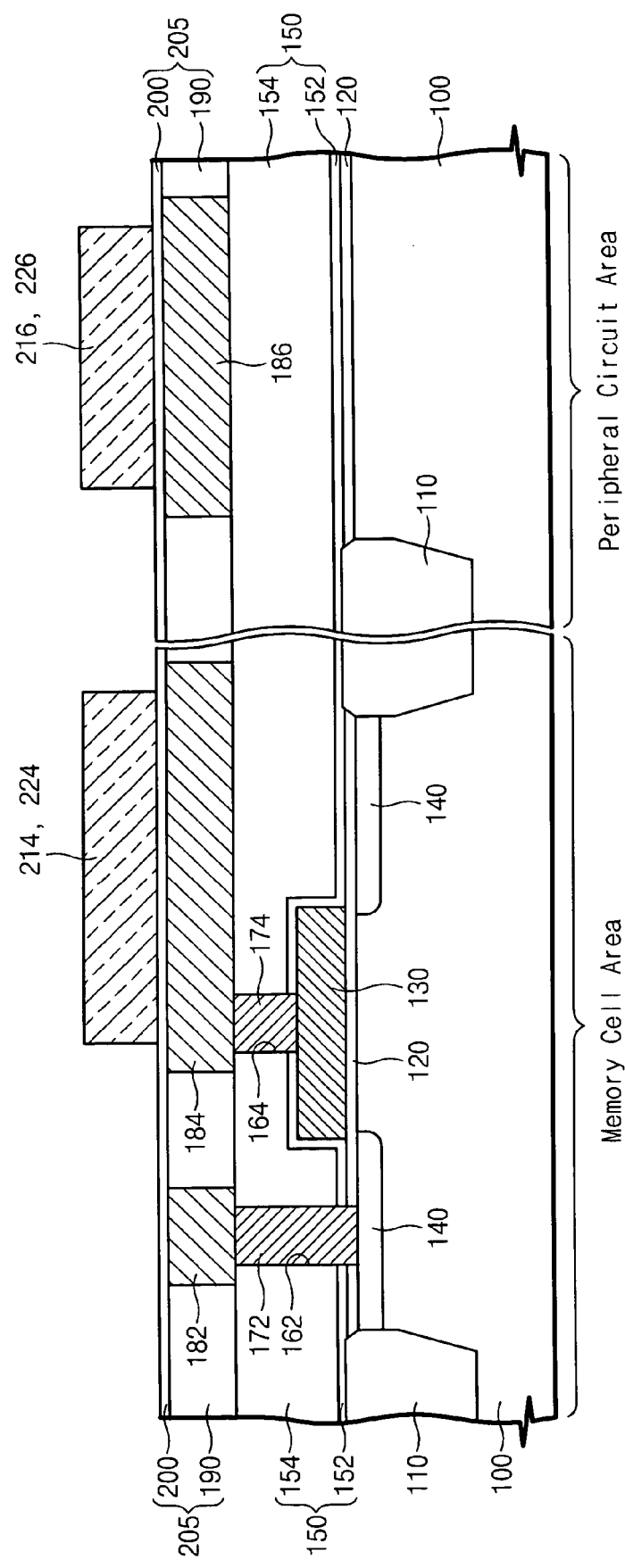
FIG. 6 is a cross-sectional view showing a method of fabricating a semiconductor device including an OTP ROM according to another embodiment of the present invention.

As shown in FIG. 6, according to another embodiment of the invention, the first upper conductive layer and the second upper conductive layer are not separated from each other. In this case, the first upper electrode 214 and the second upper electrode 224 are one body and the first upper capacitor electrode 216 and the second upper capper electrode 226 are one body.

As further shown in FIG. 6, the lower intermetal dielectric 190 may have the same height as the lower electrode 184 and the lower capacitor electrode 186. In this case, the OTP ROM opening 194 and the capacitor opening 196 are not formed.

As described above, a manufacturing process of an OTP ROM according to an exemplary embodiment of the invention includes forming a capacitor at a peripheral circuit area. Since an additional process is not needed to form the capacitor at a peripheral circuit area, fabricating cost may be reduced. Further, a gate of the OTP ROM according to exemplary embodiments of the invention does not have a stack structure, thus improving compatibility with a logic circuit. Since conventional removal of the intergate dielectric is not needed, the manufacturing process according to embodiments of the invention is simplified. In addition, since formation of a dummy pattern is not needed in a patterning process for forming a control gate electrode, occupied chip area is minimized.

According to exemplary embodiments of the present invention, the upper intermetal dielectric 200 is used as a dielectric film of a capacitor as well as an etch-stop layer in a patterning process for forming the first and second upper electrodes 214 and 224. As a result, fabricating cost of the semiconductor device is reduced and stability of the fabricating process is enhanced.

An OPT ROM and a capacitor according to another exemplary of the present invention are now described below with reference to FIG. 7A and FIG. 7B.

Figure 7A:
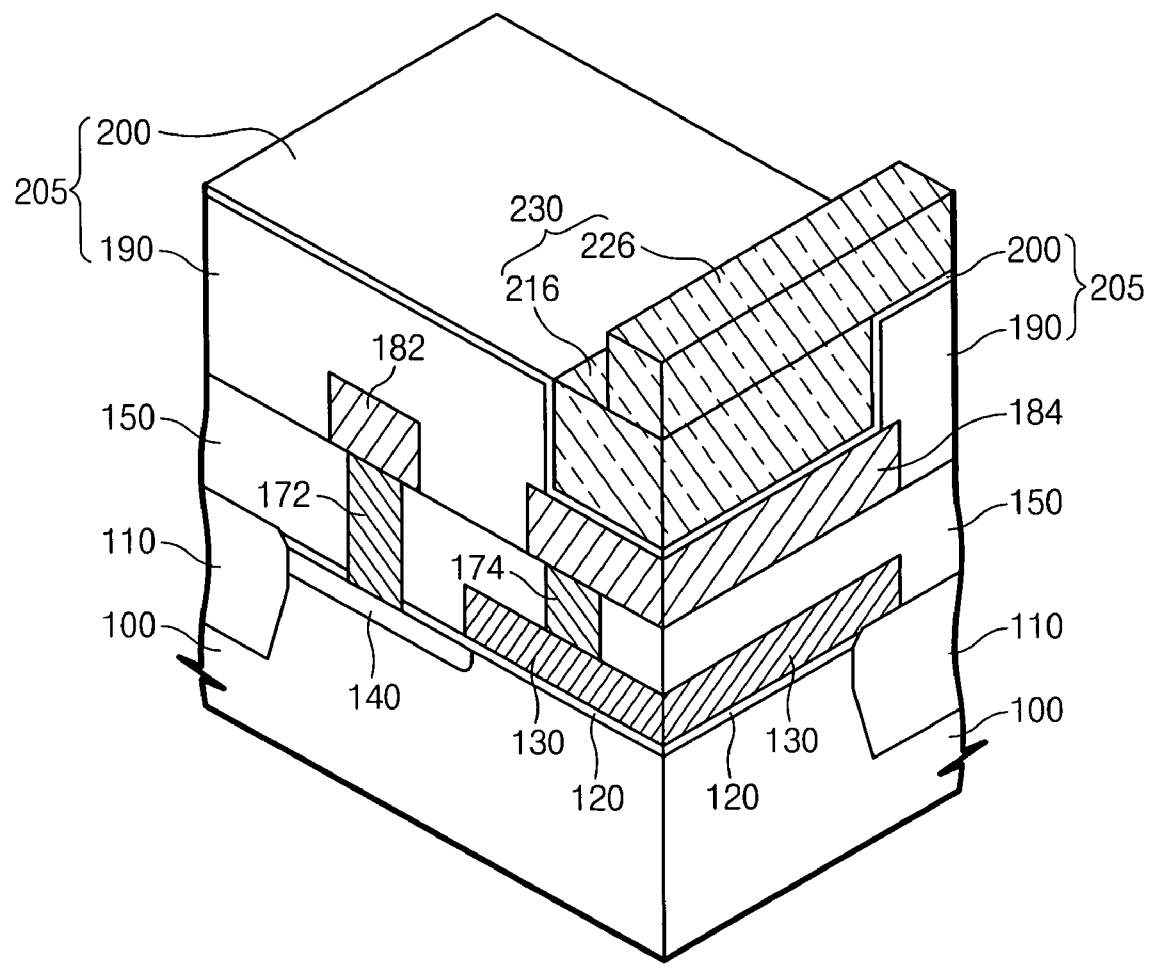
FIG. 7A and FIG. 7B are perspective views of an OTP ROM and a capacitor according to an embodiment of the present invention, respectively.
Figure 7B:
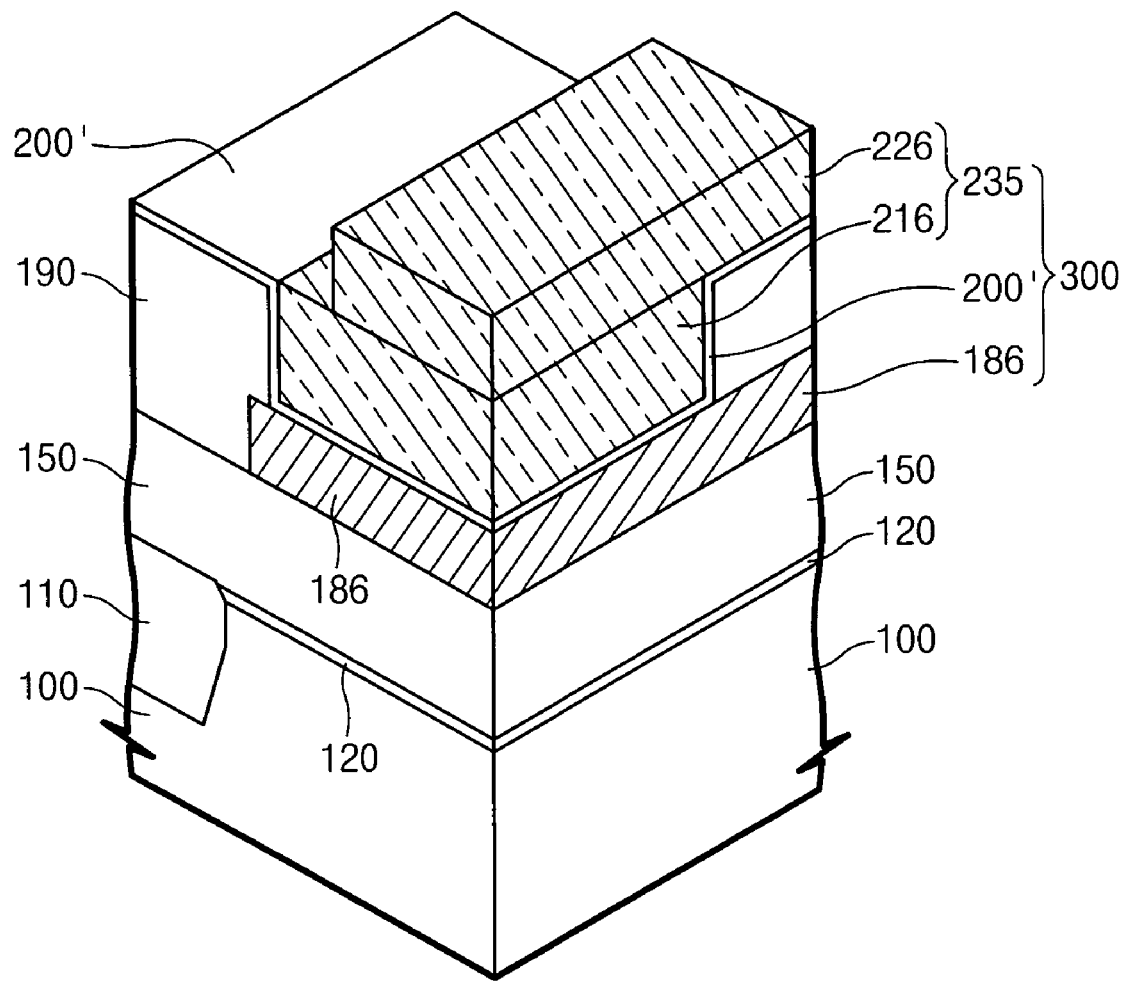

Referring to FIG. 7A and FIG. 7B, a device isolation layer 110 is disposed at a predetermined region of a semiconductor substrate 100 including a memory cell area and a peripheral circuit area to define an active region. OTP ROMs according to exemplary embodiments of the invention are formed at the memory cell area, and logic circuits according to exemplary embodiments of the invention are formed at the peripheral circuit area.

A MOS transistor having a gate insulating layer 120, a floating gate electrode 130, and an impurity region 140 is disposed at the memory cell area. The gate insulating layer 120 is preferably made of silicon oxide, and the impurity region 140 preferably contains N-type impurities. The impurity region 140 is used as a source/drain of the OTP ROM according to the present embodiment invention. The floating gate electrode 130 is cut at a top surface of the device isolation layer 110 and is not extended to an adjacent cell.

Although not shown in the figures, an NMOS or PMOS transistor may be disposed with the same height as the MOS transistor in the peripheral circuit area. An interlayer dielectric 150 is disposed on an entire surface of the semiconductor substrate 100 including the MOS transistors. A capacitor 300 used in the logic circuit is disposed on the interlayer dielectric 150. The capacitor 300 is disposed at the peripheral circuit area and includes a lower electrode 186, a dielectric film 200', and an upper capacitor electrode 235 which are stacked in the order named. Particularly, the dielectric film 200' is extended to the memory cell area to constitute the upper intermetal dielectric 200. The dielectric film 200' and the upper intermetal dielectric 200 may constitute one body.

The lower electrode 184 is electrically connected to the floating gate electrode 130 through a floating gate plug 174 penetrating the interlayer dielectric 150. The floating gate electrode 130, the floating gate plug 174, and the lower electrode 184 are completely electrically insulated and are used for charge/information storage. Unlike the lower electrode 184, the lower capacitor electrode 186 is not electrically insulated and is used as one electrode of the capacitor by being connected to an external power source to be.

A contact plug 172 may be disposed at the impurity region 140. The contact plug 172 is made of the same material as the floating gate plug 174 and penetrates the interlayer dielectric 150. In addition, a bitline 182 may be disposed on the interlayer dielectric 150 and connected to the contact plug 172.

In the above-described OTP ROM, the upper intermetal dielectric 200 or the dielectric film 200' may vary in thickness. This makes it possible to minimize the leakage current generated through the upper intermetal dielectric 200 during a programming operation. Further, a breakdown voltage between the upper electrode 230 and the lower electrode 184 may fully rise. In this case, a voltage of the floating gate electrode required for a programming operation can easily be obtained by increasing the voltage of the upper electrode 230.

While the present invention has been described in reference to illustrative embodiments, this description is not intended to be construed in a limiting sense. Various modifications and combinations of the illustrative embodiments, as well as other embodiments of the invention, will be apparent to those skilled in the art upon reference to the description. It is therefore intended that the appended claims encompass any such modifications or embodiments.

What is claimed is:

1. A semiconductor device with an OTP ROM formed over a semiconductor substrate including a memory cell area and a peripheral circuit area, the semiconductor device comprising:

a MOS transistor having a floating gate electrode, the MOS transistor being disposed at the memory cell area;

a peripheral capacitor disposed in the peripheral circuit area and including a lower capacitor electrode, a dielectric film, and an upper capacitor electrode which are stacked in the order named;

an OTP ROM capacitor having a lower electrode, an upper intermetal dielectric, and an upper electrode which are stacked in the order named, the OTP ROM capacitor being disposed over the MOS transistor; and a floating gate plug connecting the floating gate electrode with the lower electrode, a lower intermetal dielectric formed below the upper intermetal dielectric, wherein the lower intermetal dielectric has an OTP ROM opening exposing the top surface of the lower electrode and a capacitor opening exposing the top surface of lower capacitor electrode, wherein the floating gate electrode, the floating gate plug, and the lower electrode constitute a conductive structure which is electrically insulated from surrounding components, wherein the upper electrode is formed in the OTP ROM opening and the upper capacitor electrode is formed in the capacitor opening.

2. The semiconductor device as set forth in claim 1, wherein the lower electrode and the upper electrode are identical to the lower capacitor electrode and the upper capacitor electrode in material and thickness.

3. The semiconductor device as set forth in claim 1, wherein the upper intermetal dielectric and the dielectric film are identical in material and thickness.

4. The semiconductor device as set forth in claim 1, wherein the upper intermetal dielectric is made of at least one selected from the group consisting of silicon oxide, silicon nitride and silicon oxynitride.

5. The semiconductor device as set forth in claim 1, wherein the upper intermetal dielectric is disposed over an entire surface of the semiconductor substrate.

6. The semiconductor device as set forth in claim 1, further comprising a contact plug which is connected to an impurity region of the semiconductor substrate and is made of the same material as the floating gate plug.

7. The semiconductor device as set forth in claim 6, further comprising a bitline, the contact plug connecting the bitline to the impurity region of the semiconductor substrate.

8. The semiconductor device as set forth in claim 1, wherein the upper electrode comprises a first upper electrode and a second upper electrode disposed over the first upper electrode.

9. The semiconductor device as set forth in claim 1, wherein the upper capacitor electrode comprises a first upper capacitor electrode and a second upper capacitor electrode disposed over the first upper capacitor electrode.

* * * * *